United States Patent
Harikrishna Mohan et al.

(10) Patent No.: US 9,871,229 B2
(45) Date of Patent: Jan. 16, 2018

(54) OVJP FOR PRINTING GRADED/STEPPED ORGANIC LAYERS

(71) Applicant: UNIVERSAL DISPLAY CORPORATION, Ewing, NJ (US)

(72) Inventors: Siddharth Harikrishna Mohan, Plainsboro, NJ (US); Paul E. Burrows, Chattaroy, WA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/972,932

(22) Filed: Dec. 17, 2015

(65) Prior Publication Data

US 2016/0104870 A1    Apr. 14, 2016

Related U.S. Application Data

(63) Continuation of application No. 13/761,883, filed on Feb. 7, 2013, now Pat. No. 9,252,397.

(51) Int. Cl.

| | | |
|---|---|---|
| *H01L 21/00* | (2006.01) | |
| *H01L 51/56* | (2006.01) | |
| *H01L 51/00* | (2006.01) | |
| *C23C 14/24* | (2006.01) | |
| *C23C 14/56* | (2006.01) | |
| *B05B 1/00* | (2006.01) | |
| *H01L 51/50* | (2006.01) | |

(52) U.S. Cl.
CPC ............. *H01L 51/56* (2013.01); *B05B 1/005* (2013.01); *C23C 14/24* (2013.01); *C23C 14/56* (2013.01); *H01L 51/0005* (2013.01); *H01L 51/0013* (2013.01); *H01L 51/50* (2013.01)

(58) Field of Classification Search
CPC ..... H01L 51/0013; H01L 51/56; H01L 51/50; H01L 51/0005
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |

(Continued)

FOREIGN PATENT DOCUMENTS

| | | |
|---|---|---|
| WO | 2008057394 | 5/2008 |
| WO | 2010011390 | 1/2010 |
| WO | 2010111386 A1 | 9/2010 |

OTHER PUBLICATIONS

Erickson et al., "Highly efficient, single-layer organic light-emitting devices based on a graded composition emissive layer", Applied Physics Letters 97, 083308 (2010) 10.1063/1.3481426.*

(Continued)

*Primary Examiner* — Richard Booth
(74) *Attorney, Agent, or Firm* — Morris & Kamlay LLP

(57) ABSTRACT

An emissive layer deposited in graded manner using a plurality of nozzles is disclosed. A mixtures ejected from the plurality of nozzles may contain varying concentrations of host-to-dopant material. The nozzles, as disclosed, may be arranged in a sequential manner such that the order of the sequence is based on varying concentration of the host-to-dopant material. The nozzles may be configured to translate relative to an area of a substrate to allow sequential deposition.

13 Claims, 7 Drawing Sheets

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,067,170 | B2 | 6/2006 | Marcus et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2010/0245479 | A1 | 9/2010 | Forrest et al. |
| 2011/0168092 | A1 | 7/2011 | Clark et al. |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Lee, et al., "Fabrication of a blue organic light-emitting diode with a novel thermal deposition boat", J. Vac. Sci. Technol. B vol. 29(6), 062401-1, Nov./Dec. 2011, Nov./Dec. 2011.

\* cited by examiner

OVJP FOR PRINTING GRADED/STEPPED ORGANIC LAYERS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to techniques for fabricating OLEDs and OLED components and, more specifically, to printing graded organic layers multi-nozzle OVJP arrangements for the graded deposition.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

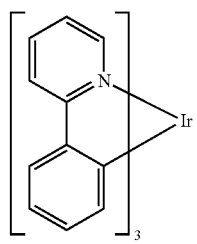

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to aspects of the disclosed subject matter, a graded emissive layer deposition device is provided that includes a first nozzle configured to eject a first mixture over a first region of a substrate, the mixture containing a host and an organic dopant. A second nozzle configured to eject a second mixture containing the host and organic dopant over the first region is also provided such that the first mixture has a different ratio of host to organic dopant than the second mixture. A plurality of nozzles, such as the first and second nozzles, may be configured to eject mixtures in a sequential order, and the order may be based on the host-to-dopant ratio of the mixture in each nozzle. The order may be based on a highest to lowest concentration of host-to-dopant ratio in the mixture in each nozzle. The plurality of nozzles may be configured to translate relative to an area of a substrate. The host may be made up of a plurality of component materials such as a plurality of host materials and the organic dopant may be made up of a primary organic dopant and one or more co-dopants According to aspects of the disclosed subject matter, a graded emissive layer deposition technique is provided that includes depositing a plurality of mixtures over a first region of a substrate, each mixture containing at least a carrier gas, an organic emissive first material, and a host second material such that each mixture contains a different ratio of the organic emissive first material to the host second material. Each mixture may be deposited through a separate nozzle towards the substrate and plurality of nozzles may be translated relative to each other, each nozzle ejecting one of the plurality of mixtures over the first region of the substrate in an ordered sequence, one mixture at a time.

According to aspects of the disclosed subject matter, a graded emissive layer deposition technique is provided that includes depositing a first electrode over a substrate. A first mixture containing an organic emissive first material, a host second material, and a carrier gas may be ejected from a first nozzle towards the first electrode. A second mixture containing the organic emissive first material, the host second material, and a carrier gas may be ejected from a second nozzle over the organic emissive first material such that the second mixture has a different concentration of the organic emissive material than the first mixture. Additionally, a second electrode may be deposited over the organic emissive first material. The first electrode may comprise one or more additional layers such as a hole transport layer (HTL), electron transport layer (ETL), or the like.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
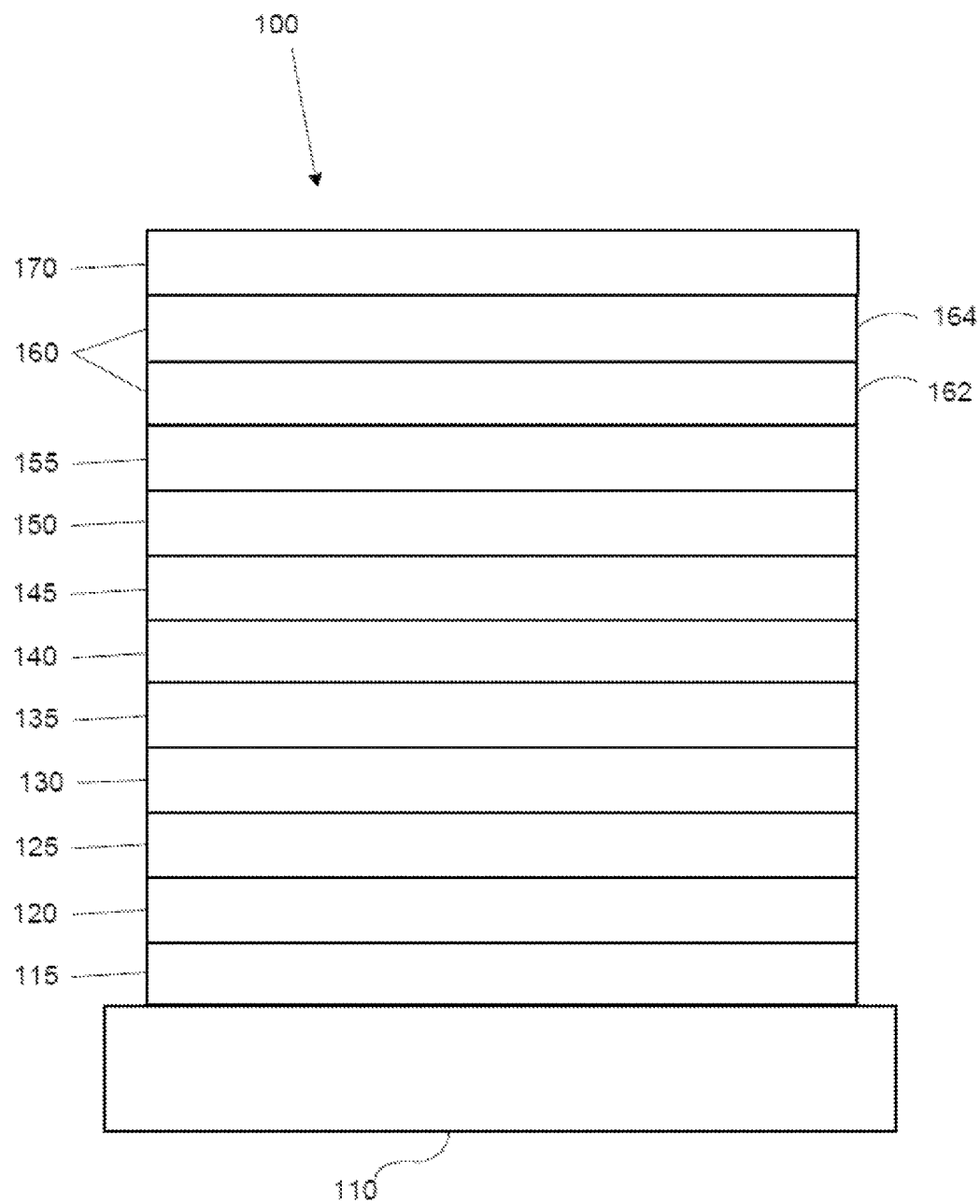
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
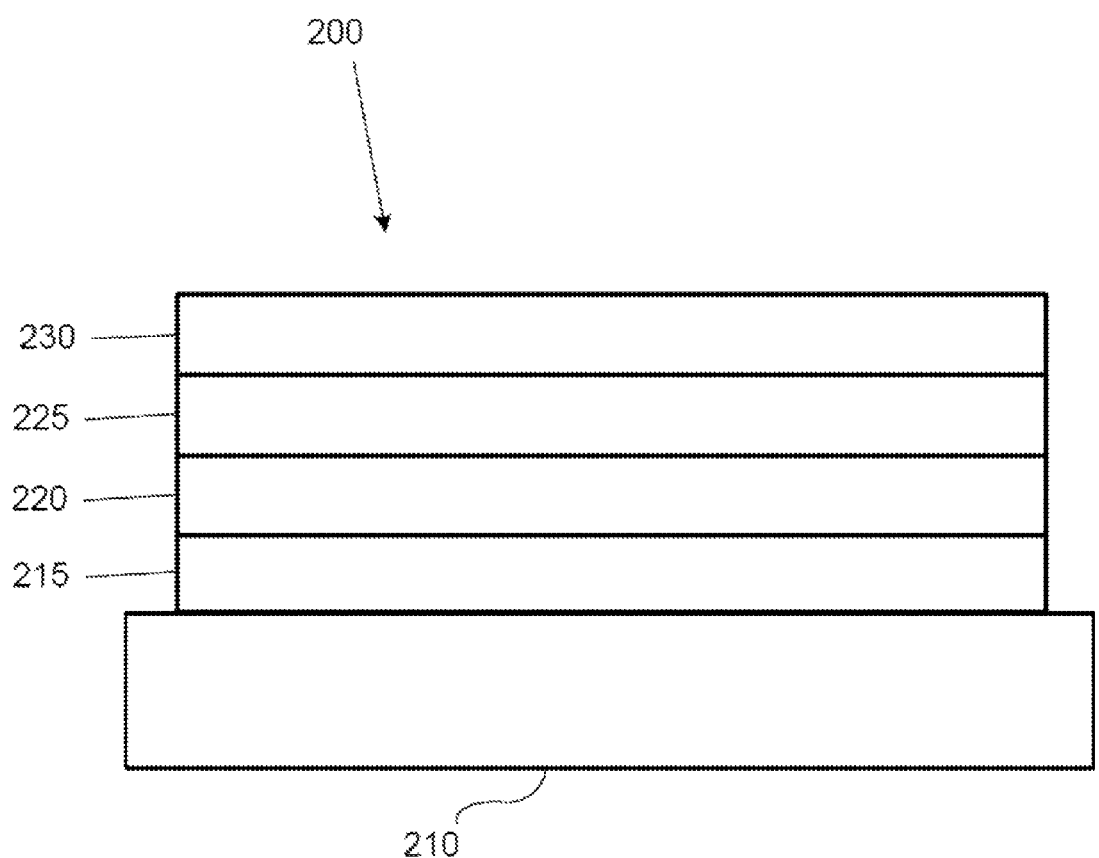
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, 3D displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

An organic light emitting device is also provided. The device may include an anode, a cathode, and an organic emissive layer disposed between the anode and the cathode. The organic emissive layer may include a host and an emissive dopant and, more specifically, may include layered steps of host and dopant, the layers containing different concentrations of the host and dopant.

Traditional emissive layers in OLED devices often are deposited such that the emissive material is distributed uniformly within the emissive layer, i.e., such that the emissive layer is uniformly doped with a particular dopant. However, a non-uniformly doped emissive layer may improve OLED operation and lifetime. The deposition rate of an emissive dopant may be adjusted during pixel deposition using a very rapid temperature response time in a VTE source. However, manufacturing an OLED panel with a graded emitter layer via VTE may require multiple linear sources, each operating at a different host to dopant ratio, which may add significant expense to the system. Such a process also may not be scalable to manufacturing dimensions due to the large linear sources required and the resulting unacceptably long response time. Additionally, manufacturing such a device with conventional solution processing techniques may not be optimal as each subsequent host/dopant layer may dissolve the previous layer. Additionally, manufacturing an OLED panel with a graded emitter layer via a process such as VTE may require a shadow mask to define pixel areas. Shadow masks may be difficult to scale to large areas and, accordingly, may not be optimal. Accordingly, a low cost, high throughput manufacturing process to deposit OLEDs with one or more graded emissive layers is desirable.

According to embodiments of the invention, graded emissive layers may be deposited using one or more nozzles which sequentially deposit material with different host to dopant ratios. A nozzle within a group of nozzles may contain a mixture with a given host to dopant ratio that is different from the ratio in at least one other nozzle in the group of nozzles. The nozzles in the nozzle group may each deposit their respective mixture over the same area of a substrate. The nozzles in the nozzle group may be OVJP nozzles, and the source temperature and flow rate for each nozzle may be adjustable individually or simultaneously to fine tune the concentration of several components making up the organic emissive layer being deposited via the nozzles. More generally, each OVJP nozzle may be adjustable using any parameters and physical arrangements known to one of skill in the art with respect to a conventional OVJP nozzle. The response time of the deposition typically corresponds to the proximity of an organic source to the nozzle and the flow conductance of the vapor path, which may result in a significantly lower response time than in conventional VTE-type processes.

According to embodiments of the invention, a nozzle group may encompass two or more nozzles. A first nozzle may contain a mixture which includes at least a host and an organic dopant. The organic dopant can correspond to a sub-pixel and more specifically may correspond to a specific color to be deposited over a region of a substrate, such as for a red, blue, green, yellow, dark blue, light blue, or infra-red sub-pixel. The host material may be the same as the material in an adjacent electron transport layer, a hole transport layer, and/or other non-emissive layer. Alternatively, the host material may be different from the material in an adjacent layer, such as an electron transport layer, hole transport layer, or the like. At least parts of adjacent layers, such as an electron transport layer, emissive layer, hole transport layer, and the like, may be aligned such that they are stacked, at least partially, proximally over or under each other.

The first nozzle may be configured to eject the mixture over a first region of a substrate. The first region may correspond to an intended electrode, such as for a specific sub-pixel in an OLED or similar device. The first nozzle may eject a given amount of mixture toward the electrode at a first time and at least one material in the mixture, such as an organic emissive material, may deposit onto the electrode. A second nozzle may eject a given amount of mixture toward the same electrode at a second time, and the mixture may deposit emissive material onto or otherwise over the first mixture and electrode. Here, the mixture ejected by the second nozzle may deposit emissive material directly on top of, or otherwise over, the emissive material deposited by the first nozzle.

According to an embodiment of the invention, the mixture ejected by the second nozzle at the second time may be similar to the mixture ejected by the first nozzle at the first time, however the mixtures may have at least one property or component that is different. For example, each mixture may include the same carrier gas and different emissive or other organic materials, or each may include the same components but at different concentrations. An amount of time sufficient to allow a material in the mixture from the first nozzle to deposit onto an electrode may be allotted such that the deposited material meets a certain criterion. The criterion may be, but is not limited to, to allow the mixture to change state, reach a desired temperature, or the like. The mixture from the second nozzle may be ejected after the amount of time for the mixture to meet the criterion has passed. Alternatively, the amount of time allotted before a subsequent nozzle deposits a mixture over an electrode may vary. In some cases, the time also may be adjusted to allow some mixing of the resulting layers or concentrations of emissive material, such as to provide for a smooth gradient of emissive material concentration between subsequent layers. It will be understood that the criteria and/or implementations discussed herein are illustrative only and are not intended to limit the scope of the subject matter. According to an embodiment of the invention, the mixture ejected from the second nozzle at the second time may be different than the mixture ejected from the first nozzle at the first time. A first mixture ejected from a first nozzle may contain a first ratio of organic dopant to host concentration. For example, the first mixture may contain a 30:70 organic dopant to host concentration, such that 30% of the organic material in the mixture corresponds to the organic dopant and 70% of the organic material in the mixture corresponds to the host. The first mixture may be ejected towards an electrode by the first nozzle and a first organic material may deposit over the electrode. Subsequently, a second mixture ejected from a second nozzle may contain a second organic dopant to host concentration of 20:80 such that 20% of the organic material corresponds to the organic dopant amount and 80% of the organic material corresponds to the host amount. The second mixture may be ejected by the second nozzle and the second organic material may deposit over the first organic material. Similarly, a third mixture ejected by a third nozzle may contain an organic dopant to host concentration of 10:90 such that 10% of the organic material in the mixture corresponds to the organic dopant amount and 90% of the organic material in the mixture corresponds to the host amount. The third mixture may be ejected by the third nozzle and the third organic material may deposit over the first and second organic material. Thus, a graded emissive layer may be formed over the electrode by depositing varyingly concentrated mixtures over the electrode. According to the techniques disclosed herein, an amount of time sufficient to allow an organic material from a first nozzle to deposit onto an electrode may be allotted such that the deposited material meets a certain criterion. A second nozzle may hold off ejecting a mixture towards the electrode until the criterion has been met.

The concentration of organic dopant to host material may be altered in any applicable way including, but not limited to, by varying the temperature of an organic material source, the flow rate of an organic material into a mixing region of a nozzle arrangement, the relative amounts of host and/or dopant provided to the mixing region, or the like. Additionally, a host material or an organic dopant material may contain at least one or more respective components. For example, the organic dopant material may contain a primary dopant material and a co-dopant material. More generally, the mixtures described herein will contain primarily two types of material: materials to be deposited over a substrate, such as organic emissive materials or other materials suitable for used in an OLED, and carrier materials, which are used to transport the materials to be deposited from the nozzle to the substrate.

Figure 3:
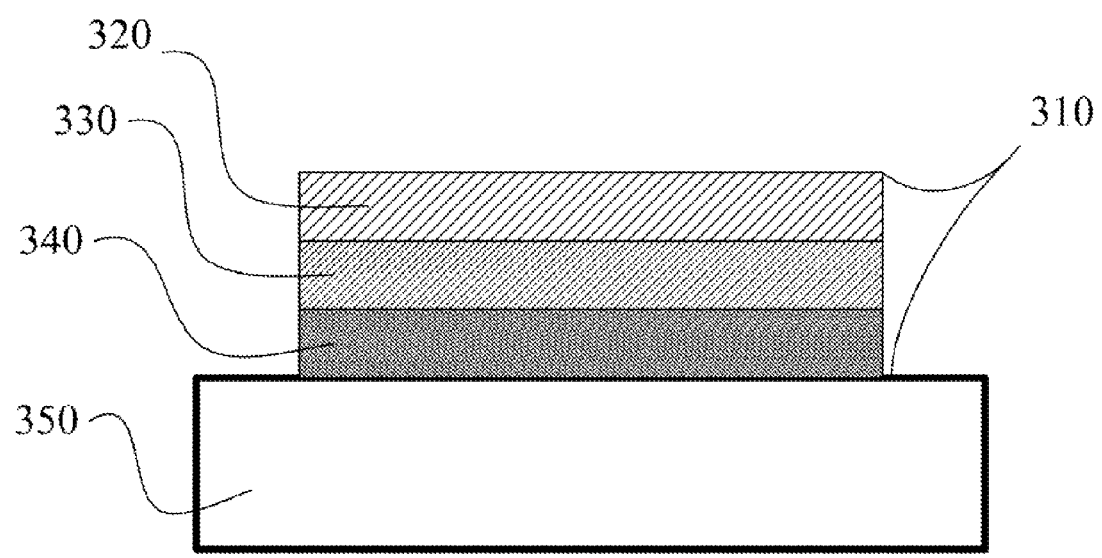
FIG. 3 shows an illustrative example of graded organic layers deposited over an electrode according to an embodiment of the invention.

FIG. 3 shows a simplified illustrative example of a graded organic layer 310 deposited over an electrode 350. An electrode 350 may be part of or disposed over a substrate. A first nozzle may eject a first mixture containing a first organic material with an organic dopant to host ratio, such as 30:70, towards the electrode. The first organic material may deposit onto the electrode to form a first part 340 of the organic layer 310. A second nozzle may eject a second mixture containing a second organic material with an organic dopant to host ratio, such as 20:80, toward the electrode 350 and the first part 340 of the organic layer 310. The second mixture may deposit over the electrode 350 and the first part 340 of the emissive layer 310 to form a second part 330 of the emissive layer 310 having the dopant-to-host ratio of the organic materials in the second mixture. Similarly, a third nozzle may eject a third mixture containing a third organic material with an organic dopant to host ratio, such as 10:90, toward the electrode 350, the first part 340 and the second part 330 of the organic layer 310. The third mixture may deposit over the electrode 350, the first part 340 and second part 330 of the organic layer 310 to form a third part 320 of the emissive layer 310. Notably, the organic layer 310 may be deposited such that the concentration of organic dopant to host is varied throughout the emissive layer 310. In this specific example, the variation is a decreased amount of organic dopant concentration in a direction away from and perpendicular to the substrate. The variance in organic dopant and host concentration between nozzles may be very minute such that a graded emissive layer is formed over an electrode. Although FIG. 3 is shown with the stated basic components of an OLED structure, it will be understood that other necessary components for OLED deposition may be used without departing from the scope and content of the example or the subject matter disclosed herein, and may be used to fabricate various different layers within an OLED. For example, the resulting variance and/or gradient in doping concentrations may allow manipulation of the charge transport properties of layers within an OLED, such as allowing for manipulation of the location and extent of an expected recombination zone within the OLED.

Figure 6A:
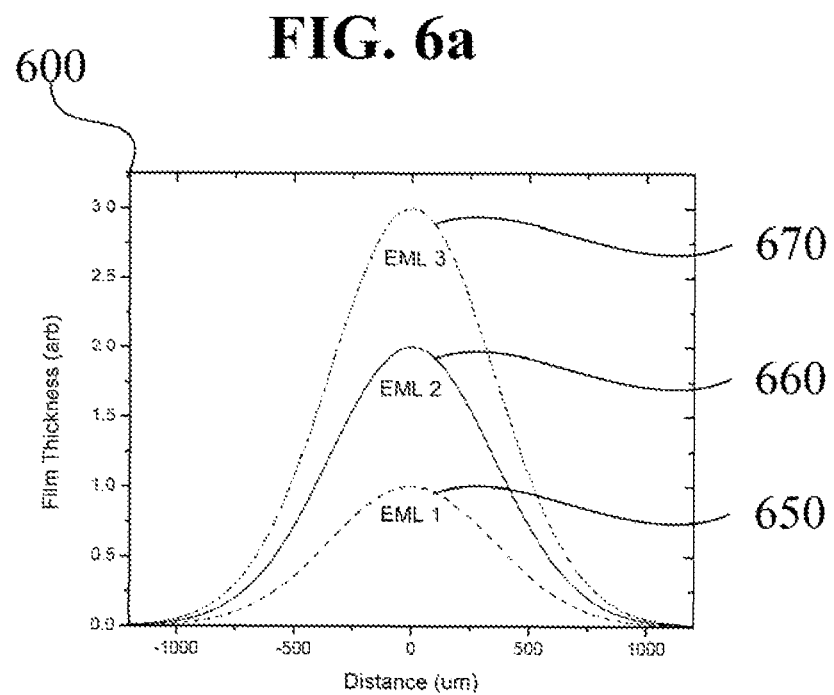
FIG. 6a shows a graphical representation of different material in a graded emissive layer according to an embodiment of the invention.
Figure 6B:
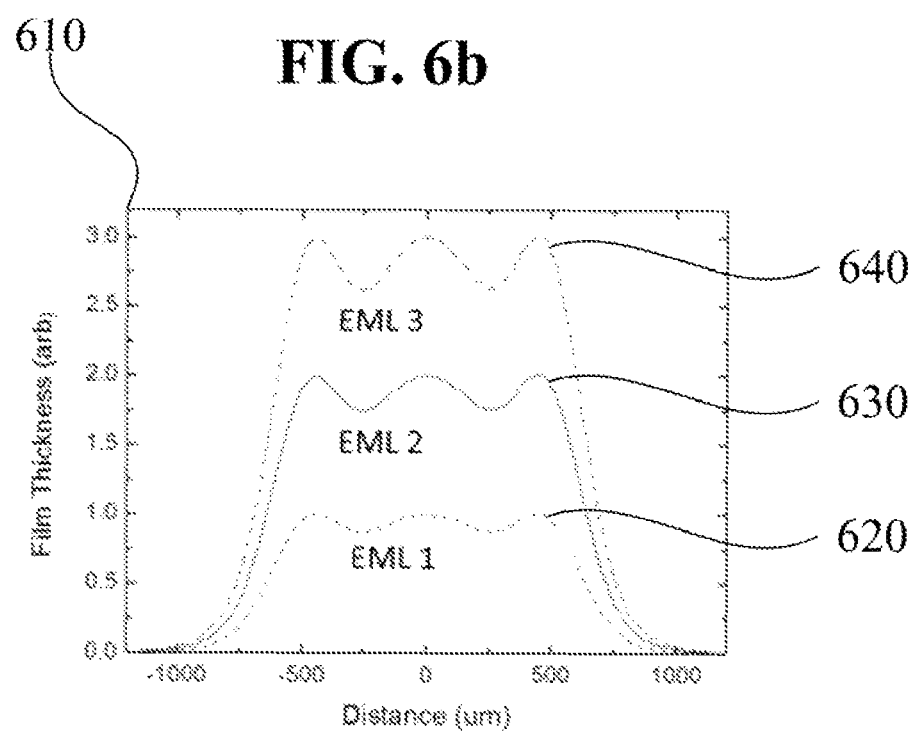
FIG. 6b shows a graphical representation of different material in a graded emissive layer deposited by multiple nozzles according to an embodiment of the invention.

FIG. 6a shows an example graphical representation 600 of a graded emissive layer. The thickness curve 650 corresponds to a first emissive layer or portion of an emissive layer EML1 such that EML1 is a first organic material deposited by ejecting a first mixture through a first nozzle toward a substrate. As shown in the graph 600, EML1 causes the emissive layer to be approximately 1.0 unit high. Similarly, the thickness curve 660 corresponds to EML2 such that EML2 is a second organic material deposited by ejecting a mixture through a second nozzle toward the same substrate. As shown in the graph 600, EML2 causes the emissive layer to be approximately 2.0 units high and is 1 unit thick (2.0 unit thickness–1.0 unit thickness). Similarly, the thickness curve 670 corresponds to EML3 such that EML3 is a third organic material deposited by ejecting a third mixture through a third nozzle toward the same substrate. As shown in the graph 600, EML3 causes the emissive layer to be approximately 3.0 units high and is itself 1 arb thick (3.0 unit thickness–3.0 unit thickness). Notably, each layer is disposed over the preceding layer or layers, resulting in a graded emissive layer that includes the materials ejected by each nozzle, deposited in order. Similarly, FIG. 6b shows an example graphical representation 610 of a graded emissive layer deposited over an electrode using a tri-nozzle arrangement such that three nozzles direct a first emissive material towards an area of the substrate at a first time, and, subsequently, three different nozzles direct a second emissive material towards the same area of the substrate at a second time. As shown in FIG. 6b, and similar to the process described with respect to FIG. 6a, emissive layers EML1 620, EML2 630, and EML3 640 may be deposited in a stacked arrangement, each deposited by a different tri-nozzle arrangement.

Figure 4:
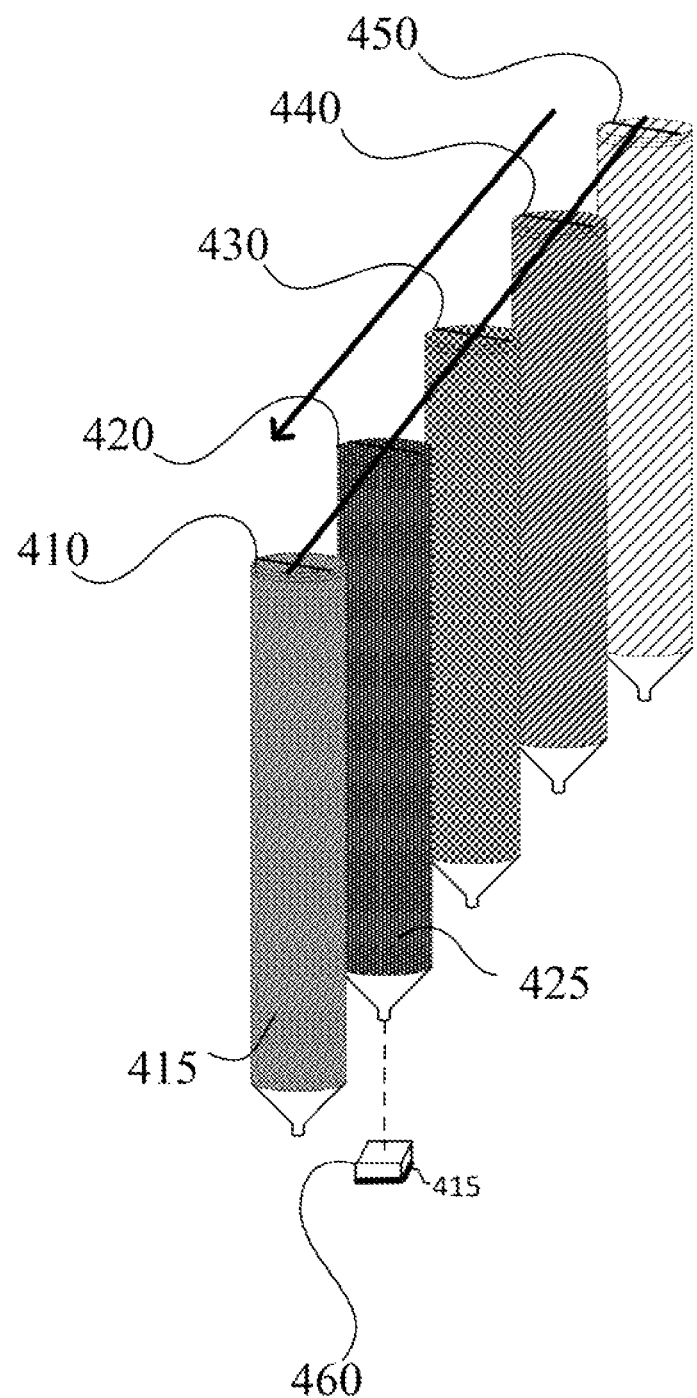
FIG. 4 shows an illustrative example of a multi-nozzle implementation for graded deposition according to an embodiment of the invention.

According to embodiments of the invention, the nozzles directing the emissive material towards the substrate may be disposed in a sequential arrangement such that a second nozzle ejects a mixture toward the intended area of the substrate subsequent to a first nozzle ejecting a mixture toward the same intended area of the substrate. The sequential arrangement may be a linear array of nozzles disposed parallel to a direction of relative motion of the nozzles and the substrate. FIG. 4 shows an illustrative example of a linear array of nozzles. The nozzles 410, 420, 430, 440, and 450 are arranged in the direction indicated by the directional arrow 470, which indicates the relative motion of nozzles and substrate. The nozzles are each disposed such that each will pass over the same portion of the substrate 480 on which the electrode is disposed.

As an example embodiment of the invention, the nozzles 410, 420, 430, 440, and 450 may be arranged such that each subsequent nozzle contains a lower concentration of organic dopant material. Specifically, nozzle 410 may contain the highest concentration of organic dopant material, followed by nozzles 420, 430, 440, and nozzle 450 containing the lowest concentration of organic dopant material. The nozzles may shift such that the first nozzle 410 is aligned over the electrode 460 at a first time, followed by the second nozzle 420 being aligned over the electrode 460 at a second time. The remainder of the nozzles may shift in the same manner such that each nozzle is over the electrode 460 in order and at a different time. Alternatively, the substrate may shift such that the electrode 460 is under the first nozzle 410 at a first time, followed by the electrode 460 aligning under the second nozzle 420. The substrate may shift similarly such that the electrode 460 is under the remainder of the nozzles in order and at different times. Each nozzle may eject the mixture contained in the respective nozzle such that a graded emissive layer is formed on the electrode. As shown in FIG. 4, the organic material 415 corresponding to the mixture in the first nozzle 410 can be ejected over the electrode prior to the electrode 460 shifting under the second nozzle 420 and before the second nozzle ejects mixture 425 towards the electrode 460.

Figure 7:
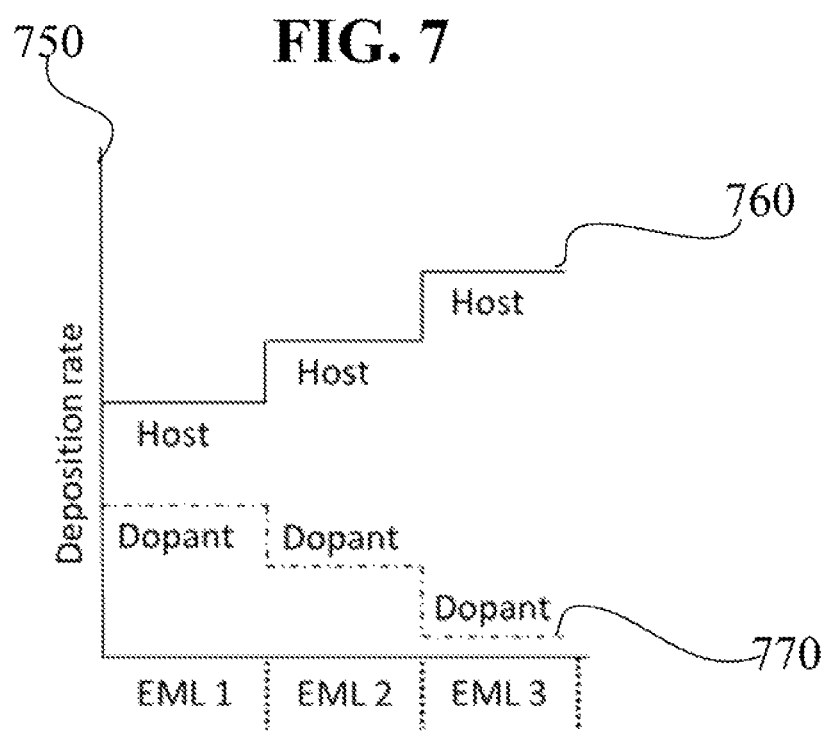
FIG. 7 shows a graphical representation of different concentrations of material in a graded emissive layer according to an embodiment of the invention.

FIG. 7 shows an example graphical representation 750 of a graded organic layer deposited using multiple nozzles. According to this example, each of the layers, EML1, EML2, and EML3 may be deposited using a different nozzle in a nozzle row. The host concentration step line 760 and dopant concentration step line 770 illustrate a ratio of host-to-dopant material in the graded organic layer. According to this example, each of the layers EML1, EML2, and EML3 may contain the same amount of total host and dopant material. However, it shall be understood that such an implementation is not required, and the ratios and components of the organic marital may vary from one layer to another. The organic material corresponding to EML1 contains a host-to-dopant ratio such that the dopant material concentration is higher and the host material concentration is lower in EML1 in comparison to EML2. Similarly, the second organic material corresponding to EML2 contains a host-to-dopant ratio such that the dopant material concentration is higher and the host material concentration is lower in EML2 in comparison to EML3. EML3 contains a higher host material concentration and a lower dopant material concentration than both EML2 and EML1. Notably, the graph shows that the concentration of host-to-dopant in mixtures deposited by respective nozzles changes in steps. However, it will be apparent to one of skill in the art that the different concentrations of material and the number of nozzles used may be adjusted to achieve a desired degree of smoothness to the steps, for example by using a sufficient number of nozzles that the gradient 760 may be essentially smooth, without abrupt changes between sub-layers within the deposited layer.

Figure 5:
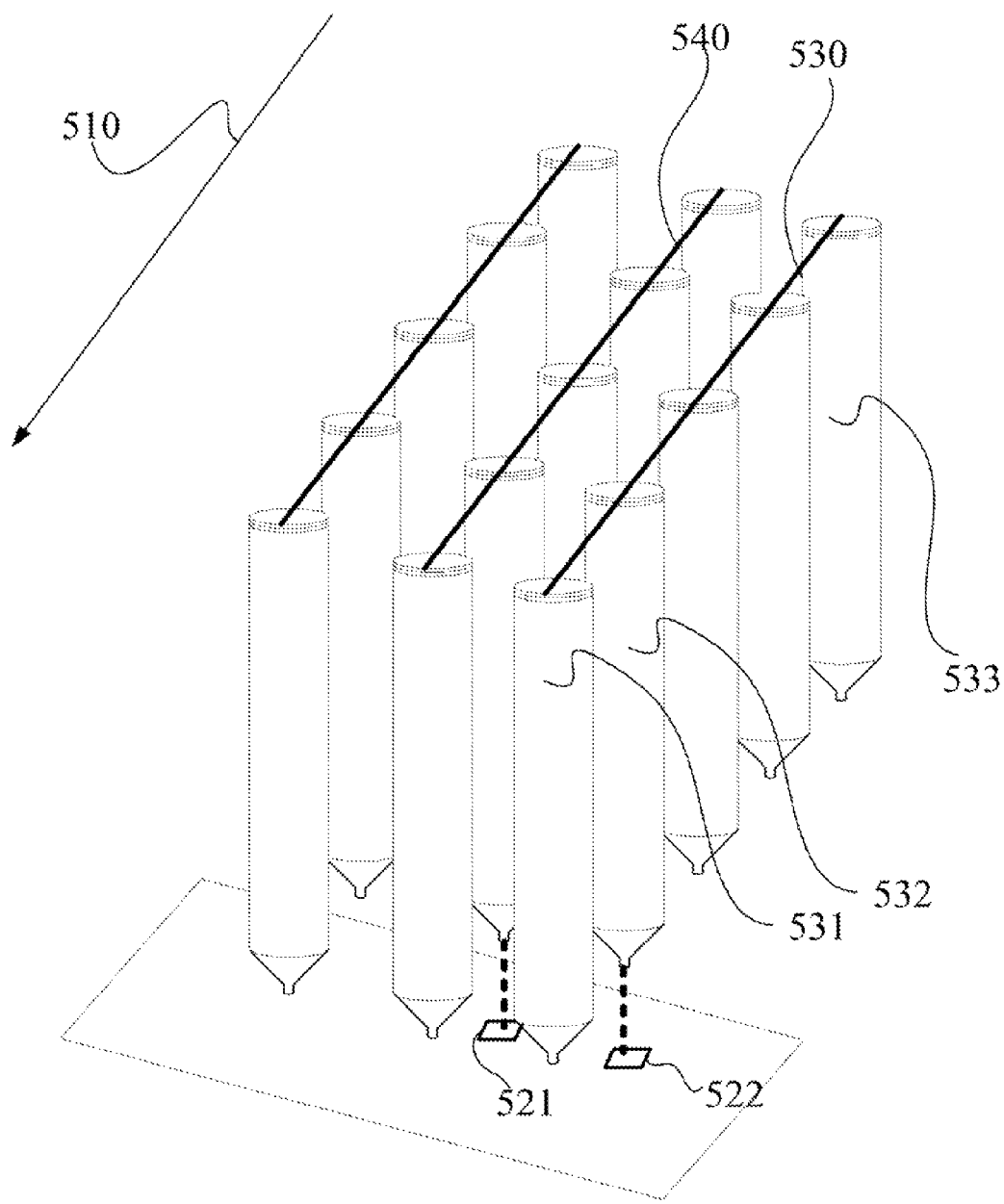
FIG. 5 shows an illustrative example of a multi-nozzle grid implementation for graded depositions according to an embodiment of the invention.

According to embodiments of the invention, multiple nozzles also may be arranged in a grid configuration. A grid formation may allow deposition over multiple electrodes, decreasing manufacturing time for an OLED device. As shown in FIG. 5, nozzles in multiple nozzle rows such as rows 530 and 540 may eject mixtures toward areas of a substrate, such as electrodes 522 and 521 respectively, according to techniques disclosed herein. The multiple rows may eject the mixtures in their nozzles over respective areas by shifting over the respective areas, in order, such that one nozzle in a nozzle row eject a mixture over an area at one time, and another nozzle in the same nozzle row ejects a mixture over the same area at another time, according to techniques disclosed herein. For example, the nozzles may shift in the direction indicated by arrow 510 such that nozzles including, and in the same row position as, nozzle 531 in nozzle row 530 eject first and nozzles including, and in the same row position as, nozzle 533 eject last, with the intermediate nozzles depositing in the respective order. Alternatively, the substrate may shift such that one or more electrodes on the substrate are under one or more respective nozzles, in order, such that one nozzle in a row ejects a mixture at one time, and another nozzle in the same row ejects a mixture at another time, according to techniques disclosed herein. For example, the substrate may shift in the direction opposite of the direction indicated by arrow 510 such that the electrodes including electrode 522 on the substrate is under nozzle 531 in nozzle row 530 at a first time, followed by being under nozzle 532 at a second time, and continuing in the same order until it is under nozzle 533 at a last time. In this example, the other electrodes, such as electrode 521, also shift under their respective nozzle rows in the same manner.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method comprising:
   depositing a plurality of mixtures over a first region of a substrate, each mixture comprising a carrier gas, an organic emissive first material and a host second material;
   wherein each mixture comprises a different ratio of the organic emissive first material to the host second material, and
   wherein the plurality of mixtures are deposited so as to form graded layers, and the ratio of the organic emissive first material to the host second material varies from one layer to another.

2. The method of claim 1, wherein each mixture is deposited through a separate nozzle.

3. The method of claim 2, further comprising:
   translating the substrate and a plurality of nozzles relative to one another, each nozzle ejecting one of the plurality of mixtures.

4. The method of claim 1, wherein each of the plurality of nozzles ejects one of the plurality of mixtures over the first region of the substrate.

5. The method of claim 4, wherein the plurality of nozzles eject the mixtures in an ordered sequence, one mixture at a time.

6. A device fabricated according to the method recited in 10, wherein the device is selected from a group consisting of a flat panel display, a computer monitor, a medical monitor, a television, a billboard, a light for interior or exterior illumination and/or signaling, a heads up display, a fully transparent display, a flexible display, a laser printer, a telephone, a cell phone, a personal digital assistant, a laptop computer, a digital camera, a camcorder, a viewfinder, a micro-display, a vehicle, a large area wall, a theater or stadium screen, and a sign.

7. A method comprising:
depositing a first electrode over a substrate;
ejecting a first mixture comprising an organic emissive first material, a host second material, and a carrier gas from a first nozzle towards the first electrode;
depositing a second mixture comprising the organic emissive first material, the host second material, and a carrier gas from a second nozzle over the organic emissive first material, the second mixture having a different concentration of the organic emissive material than the first mixture, wherein the first and second mixtures are deposited so as to form graded layers, and the ratio of the organic emissive first material to the host second material varies from one layer to another; and
depositing a second electrode over the organic emissive first material.

8. The method of claim 1, wherein components of the organic emissive first material vary from one layer to another in the deposited graded layers.

9. The method of claim 1, wherein components of the organic emissive first material are the same from one layer to another in the deposited graded layers.

10. The method of claim 7, wherein components of the organic emissive first material vary from one layer to another in the deposited graded layers.

11. The method of claim 7, wherein components of organic emissive first material is the same from one layer to another in the deposited graded layers.

12. The method of claim 1, wherein each layer of the deposited graded layers contains substantially the same amount of total organic emissive first material and host second material, but the ratios and components of the organic emissive first material to the host second material varies from one layer to another.

13. The method of claim 7, wherein each layer of the deposited first and second mixtures contains substantially the same amount of total organic emissive first material and host second material, but the ratios and components of the organic emissive first material to the host second material varies from one layer to another.

* * * * *